(12) United States Patent
Chavan et al.

(10) Patent No.: US 10,078,521 B2
(45) Date of Patent: Sep. 18, 2018

(54) HYBRID BIT-SLICED DICTIONARY ENCODING FOR FAST INDEX-BASED OPERATIONS

(71) Applicant: Oracle International Corporation, Redwood Shores, CA (US)

(72) Inventors: Shasank Kisan Chavan, Menlo Park, CA (US); Phumpong Watanaprakornkul, Bangkok (TH); Amit Ganesh, San Jose, CA (US); Vineet Marwah, San Ramon, CA (US)

(73) Assignee: Oracle International Corporation, Redwood Shores, CA (US)

( * ) Notice: Subject to any disclaimer, the term of this patent is extended or adjusted under 35 U.S.C. 154(b) by 458 days.

(21) Appl. No.: 14/242,778

(22) Filed: Apr. 1, 2014

(65) Prior Publication Data
US 2015/0277917 A1  Oct. 1, 2015

(51) Int. Cl.
*G06F 9/38* (2018.01)
*G06F 9/30* (2018.01)
*H03M 7/30* (2006.01)

(52) U.S. Cl.
CPC ........ *G06F 9/3887* (2013.01); *G06F 9/30032* (2013.01); *H03M 7/3088* (2013.01); *H03M 7/3091* (2013.01); *H03M 7/6005* (2013.01); *H03M 7/6017* (2013.01); *H03M 7/6023* (2013.01); *H03M 7/707* (2013.01)

(58) Field of Classification Search
None
See application file for complete search history.

(56) References Cited

U.S. PATENT DOCUMENTS

| 2009/0174583 | A1* | 7/2009 | Diaz-Gutierrez | ....... H03M 7/40 341/65 |
| 2013/0166566 | A1* | 6/2013 | Lemke | .............. G06F 17/30483 707/741 |
| 2014/0372389 | A1* | 12/2014 | Barber | .............. G06F 17/30153 707/693 |

\* cited by examiner

*Primary Examiner* — John Lindlof
(74) *Attorney, Agent, or Firm* — Hickman Palermo Becker Bingham LLP (57) ABSTRACT

Techniques are described herein for storing and processing codes included in dictionary-encoded data. In an embodiment, for each respective code of a plurality of codes in the dictionary-encoded data: a plurality of bits from a first portion of the respective code is contiguously stored. One or more bits from a second portion of the respective code is stored in one or more slices. Each respective slice of the one or more slices stores a bit from the one or more bits with a corresponding bit position in the respective code. In another embodiment, a bit-vector is generated based on at least one slice by loading each respective bit of the plurality of bits into different respective partitions in a register at a bit position corresponding to the at least one slice. A plurality of codes may be reconstructed by combining the bit-vector with one or more other bit-vectors.

25 Claims, 9 Drawing Sheets

Dictionary 106

| CODE | COUNTRY |
|------|---------|
| 01101 | BRAZIL |
| 10001 | INDIA |
| 10101 | IRELAND |
| 11001 | JAPAN |
| 11101 | UNITED STATES |

Dictionary-Encoded Data Object 104

| 01101 | 10101 | 11101 | 10001 | 11101 | 11001 | 10101 | • • • |

Data Object 102

| COUNTRY |
|---------|
| BRAZIL |
| IRELAND |
| UNITED STATES |
| INDIA |
| UNITED STATES |
| JAPAN |
| IRELAND |
| • • • |

HYBRID BIT-SLICED DICTIONARY ENCODING FOR FAST INDEX-BASED OPERATIONS

FIELD OF THE INVENTION

The present disclosure relates to data encoding, generally, and, more specifically, to techniques for storing and processing dictionary-encoded data for fast index-based operations.

BACKGROUND

Dictionary encoding is a technique used to compress data and minimize accesses to memory within data storage and management systems. According to this technique, strings or other data items are replaced with smaller tokens, referred to as dictionary codes. Each dictionary code maps to a corresponding entry in a data structure (the "dictionary"), where the replaced data item is stored. For example, a database table may have multiple recurring string values for a particular attribute/column. Instead of storing multiple instances of a string value each time it appears in a column, a single instance of the string value may be stored in the dictionary. Each instance of the string value may then be replaced with a dictionary code identifying the position of the string value within the dictionary. Accordingly, the overhead associated with storing and accessing the table may be significantly reduced, especially where there is a frequent rate of recurrence for large string values.

Dictionary-encoded columns in columnar databases may be stored horizontally such that codes are contiguously and tightly packed together in memory. For example, if each code consumes five bits, then the first five bytes of a column may yield eight codes. Thus, there is no bit spacing or padding between the codes, and each code is stored in contiguous order. This format allows for relatively efficient storage and retrieval of dictionary codes within the column.

Another format for storing dictionary-encoded columns is to lay the codes out vertically in slices, where each slice is a bit-vector including bits corresponding to the same position in all codes. Vertically storing dictionary-encoded columns may allow for faster comparison scans than the horizontal format. However, certain operations may require one or more codes to be fully reconstructed so that they may be used as indexes into the dictionary to obtain the decoded value. Reconstructing dictionary codes may be an expensive operation that negates the benefits of having dictionary-encoded columns stored in this format.

In order to overcome the drawbacks of the vertical storage format, one approach is to maintain two separate copies of the column—one with vertically-stored dictionary codes and another with horizontally-stored codes. During scan operations, the vertically-stored dictionary codes are used, and during index-based operations, the horizontally-stored codes are accessed. While faster scans may be achieved without the need to reconstruct the codes for index-based operations, maintaining two copies of a column significantly increases storage and maintenance requirements for the column.

In other approaches, a single-instruction, multiple data (SIMD) architecture is used to evaluate expressions on dictionary codes. According to such approaches, SIMD instructions are used to extract multiple dictionary codes into separate partitions (also referred to as elements) within SIMD registers. In a single instruction cycle, all values within the SIMD registers are compared with a target value. Thus, data level parallelism may be exploited to significantly decrease the processing time associated with performing scans and other operations involving codes from the dictionary. However, current SIMD instruction sets in modern architectures do not operate easily at the bit-level, as SIMD registers are partitioned at the byte-level. Separating codes of different widths out into SIMD register elements may result in added expense and wasted resources. For example, each five-bit code may be deposited into a sixteen-bit element in a SIMD register, resulting in eleven of the sixteen bits of each element being "wasted" during processing. Thus, the SIMD registers are not fully utilized during operations on dictionary codes, such as scan and index-based operations.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Various embodiments are illustrated by way of example, and not by way of limitation, in the figures of the accompanying drawings and in which like reference numerals refer to similar elements and in which.

DETAILED DESCRIPTION

Techniques are described herein for hybrid bit-sliced dictionary encoding. In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

General Overview

According to embodiments described herein, dictionary-encoded data is stored in a vertical and/or hybrid bit-sliced format. The vertical format lays the codes out in slices, where each slice is a bit-vector including bits corresponding to the same position in a plurality of codes. The hybrid format splits codes into horizontal and vertical components, where the horizontal component stores a portion of the code in a horizontal format, and the vertical component stores a different portion of the code in a vertical format. The hybrid format described herein allows for relatively efficient index-based operations without sacrificing the significant scan speeds associated with vertically storing dictionary codes. The vertical and hybrid formats may further be used with SIMD instructions to evaluate query expressions without wasting SIMD register space.

Techniques are also described herein for efficiently reconstructing codes that are stored in a vertical or hybrid format. In some embodiments, lookup tables and/or hardware instructions are used to parallelize reconstruction of dictionary codes. The lookup tables and/or hardware instructions generate one or more bit-vectors from a vertical component of stored dictionary-encoded data. One or more bitwise operations are performed to combine bit-vectors and generate a final result bit-vector that includes a plurality of reconstructed codes. SIMD registers may be used to parallelize the reconstruction of the codes.

Dictionary-Encoded Data

Dictionary-encoded data, as used herein, may comprise any data that is encoded using dictionary codes. The format of the data that is encoded may vary from implementation to implementation. Example data that may be encoded may include, without limitation, a set of strings or text stored in a column, row, text file, or other data object. The dictionary codes generally comprise any data that maps to the encoded data in a data structure referred to herein as a dictionary. For example, each dictionary code may be a set of bits that correspond to a different entry in the dictionary.

Figure 1:
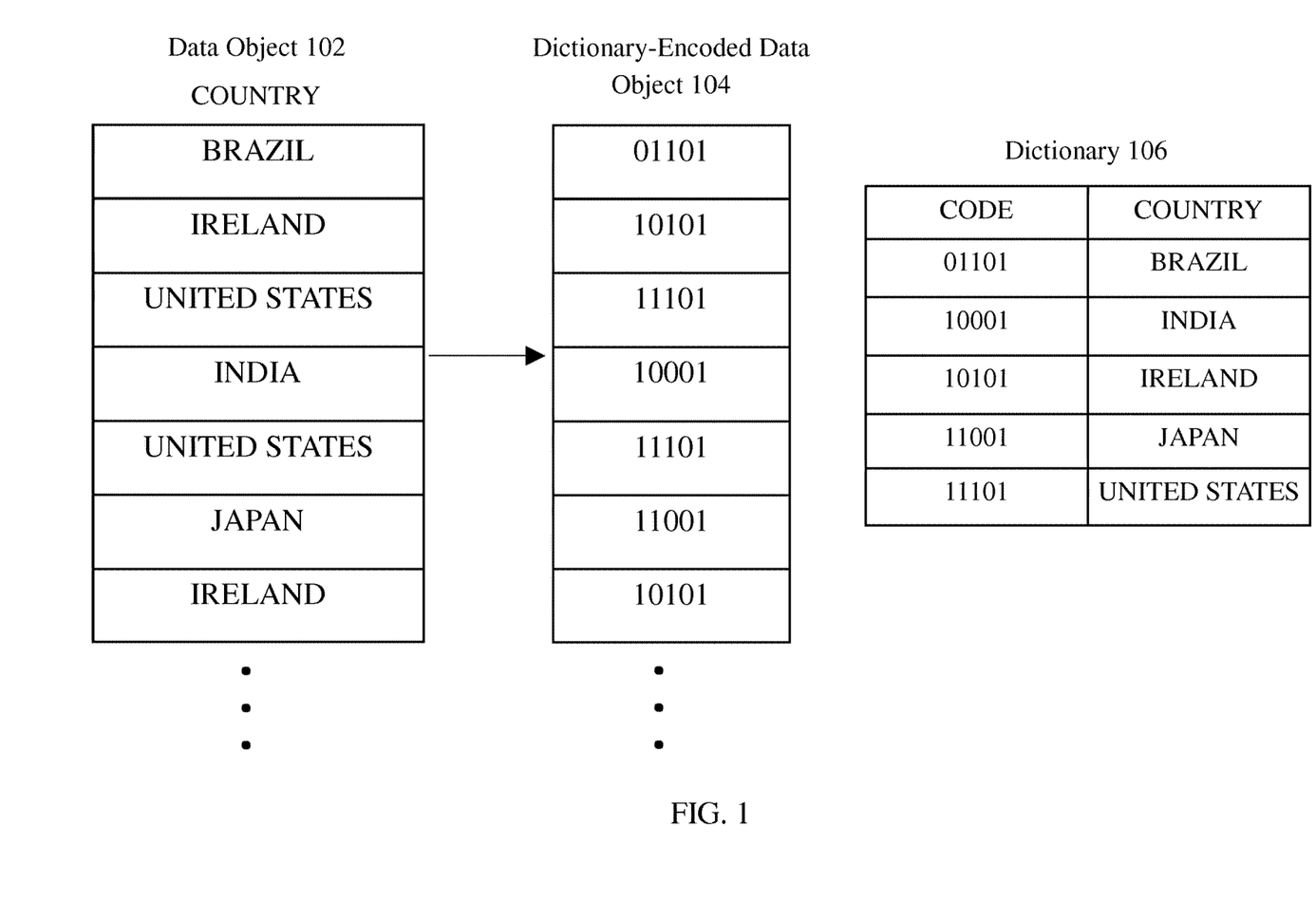
FIG. 1 is a block diagram depicting example dictionary-encoded data, according to an embodiment.

FIG. 1 is a block diagram depicting example dictionary-encoded data, according to an embodiment. Data object 102 is a column storing a set of string values corresponding to various country names before encoding takes place. Dictionary-encoded data object 104 depicts the same column after dictionary-encoding has occurred. Each country name in the column is replaced with a corresponding dictionary code. The mapping between country names and dictionary codes is maintained by dictionary 106.

Vertical and Hybrid Bit-Sliced Formats

Vertical dictionary-encoded data lays the codes out in slices, where each slice is a bit-vector including bits from a plurality of codes corresponding to a particular bit position. For a data object with five-bit codes, for example, a total of five slices (or bit-vectors) may be generated. The first slice may hold the most significant bit (the $4^{th}$ bit) of each code in the data object, the second slice may hold the next most significant bit (the $3^{rd}$ bit) of each code in the data object, etcetera, with the last slice having the least significant bit of each code (the $0^{th}$ bit).

The hybrid representation/format for dictionary codes divides a set of codes into a horizontal component and a vertical component, according to an embodiment. The horizontal component stores one portion of each code in a horizontal format (herein referred to as the "horizontal portion" of a code), while the vertical component stores the remaining portion of the code in a vertical format (herein referred to as the "vertical portion" of a code). For example, the horizontal portion may include n contiguous bits of a code, such as the first or last n bits of the code, where n is a positive integer that is less than the total number of bits in the code. The remaining bit(s) of the code—the one or more bits not included in the horizontal portion—are stored in one or more slices, where different bits are stored in different slices corresponding to their respective bit position. The bits in the horizontal portion of a code are stored contiguously within the horizontal component. By contrast, the bits of the vertical portion of a code are not stored contiguously in relation to other bits in the code. Rather, the bits in the vertical portion are divided across one or more slices. Each of the slices may correspond to a particular bit position and include bits in the same bit position from all codes in the set of codes.

The boundary between the horizontal portion and the vertical portion of a code may vary from implementation to implementation. In some embodiments, the boundary may be byte-aligned such that the horizontal portion of the code forms n bytes, where n is a positive integer. As an example, if thirteen-bit codes are being used, then the hybrid representation may comprise a vector of eight-bit codes packed together representing the upper eight-bits of the code (the horizontal portion) followed by five slices for the remaining five bits of each code. Similarly, if eighteen-bit codes are being used, then the hybrid bit representation may comprise a vector of sixteen-bit codes packed together followed by two slices for the remaining two bits of each code. Byte-aligned boundaries optimize processing using SIMD registers that are partitioned at the byte-level.

Figure 2:
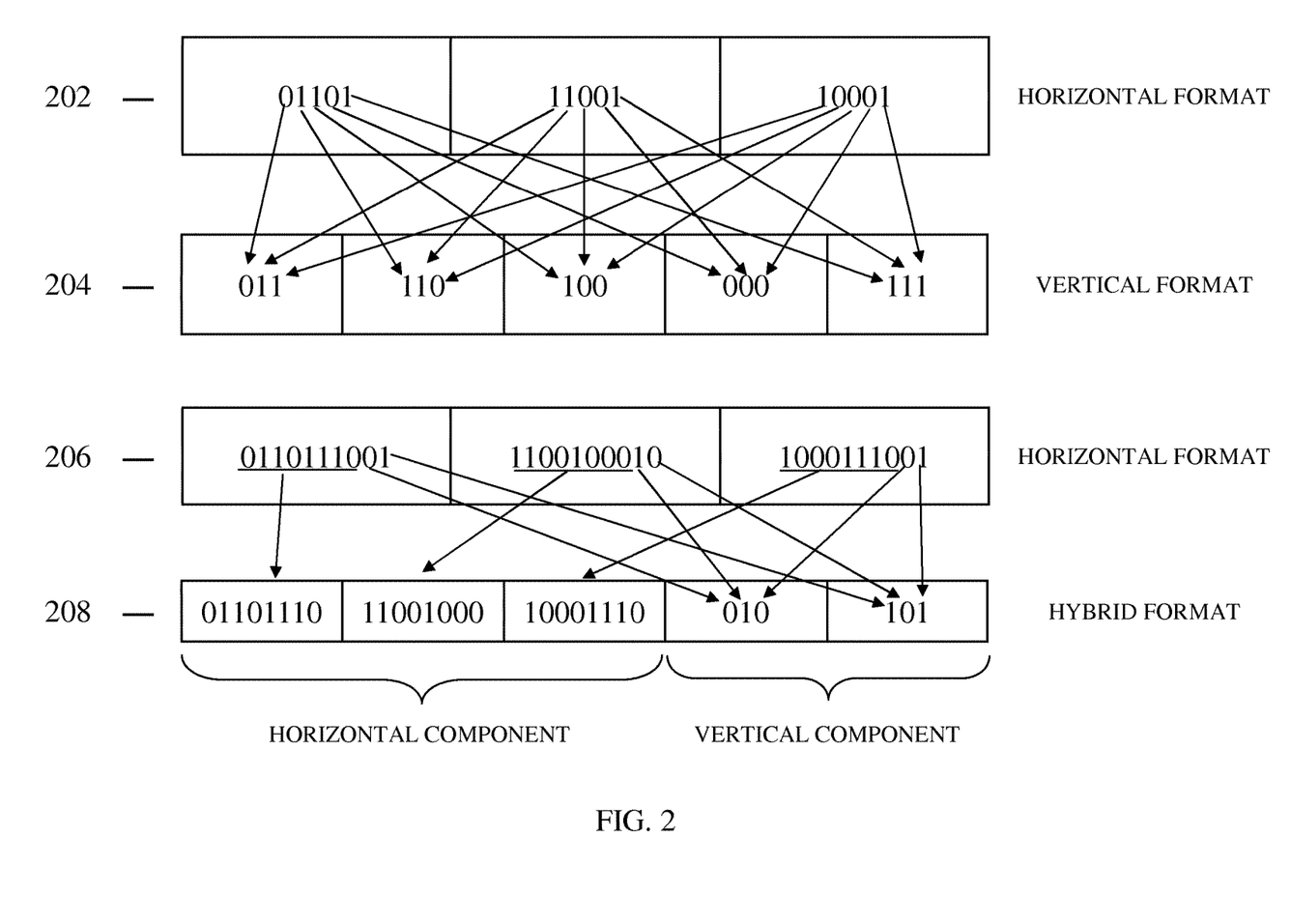
FIG. 2 is a block diagram depicting different storage formats for dictionary-encoded data, according to an embodiment.

FIG. 2 is a block diagram depicting different storage formats for dictionary-encoded data, according to an embodiment. Dictionary-encoded data 202 includes three five-bit codes: 01101, 11001, and 10001. In the horizontal format, these codes are laid out contiguously in memory with one code directly following the next. In the vertical format, the codes are laid out in memory as depicted by slices 204. Each slice corresponds to a different bit position and holds the bits at the corresponding bit position for each of the three codes. The most significant bit (the $4^{th}$ bit) of the first code in dictionary-encoded data maps to the most significant bit (the $2^{nd}$ bit) in the first slice of slices 204, the most significant bit of the second code maps to the next most significant bit (the $1^{st}$ bit) in the first slice, and the most significant bit of the third code maps to the next bit (the $0^{th}$ bit) of the first slice. For the second slice, the next most significant bit (the $3^{rd}$ bit) of the first, second, and third codes are stored by the second slice in that order. Similarly, bits in the $2^{nd}$ bit position map to the third slice, bits in the $1^{st}$ bit position to the fourth slice, and bits in the $0^{th}$ bit position to the fifth slice. Accordingly, the slices are stored in memory as follows: 011, 110, 100, 000, and 111.

Dictionary-encoded data 206 includes three ten-bit codes: 0110111001, 1100100010, and 1000111001. In hybrid representation 208, the first eight bits of each code are stored in horizontal format. Accordingly, 01101110, 11001000, and 10001110 are stored contiguously in memory. The remaining two bits are stored vertically in two slices corresponding to the different bit positions. The first slice stores 010 corresponding to the bit in the $1^{st}$ bit position for each code, and the second slice stores 101 corresponding to the bit in the $0^{th}$ bit position for each code. In alternative embodiments, the boundary between the horizontal and vertical portions may be different and/or the horizontal component may store the lower bits of the code rather than the upper bits. For example, the first two bits of each code may be stored in vertical format while the last eight bits may be stored in horizontal format.

Figure 3:
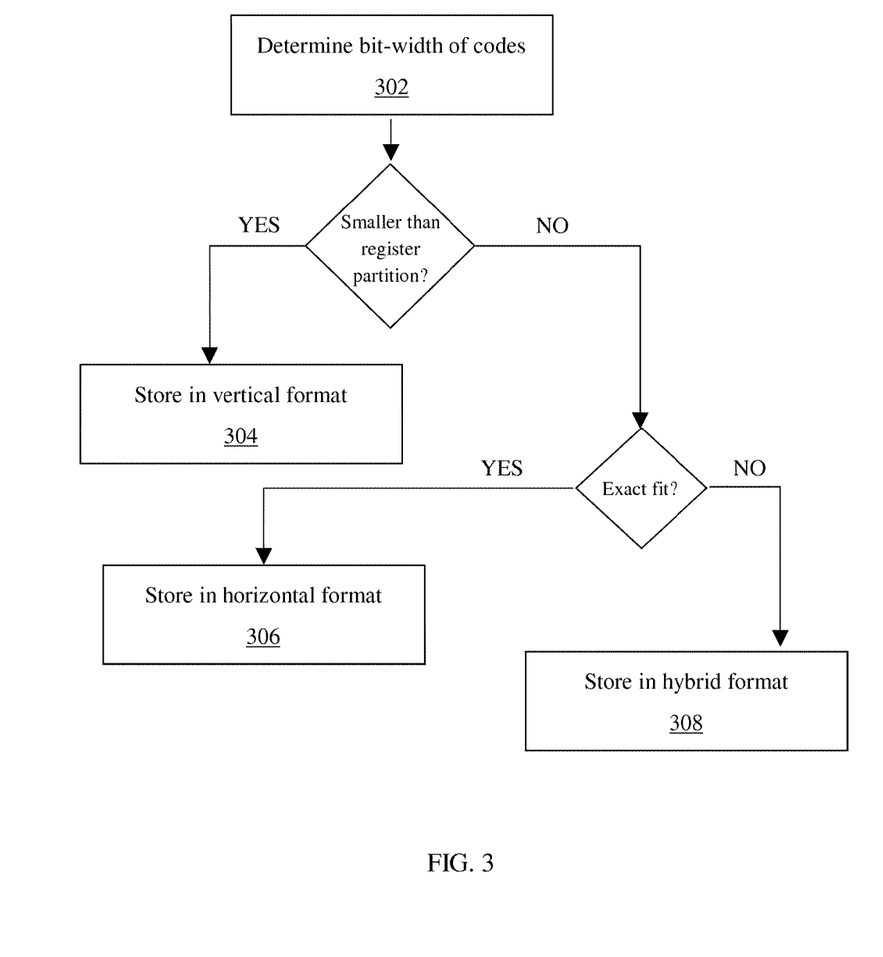
FIG. 3 is a flowchart depicting an example process for determining a storage format for dictionary encoded data, according to an embodiment.

FIG. 3 is a flowchart depicting an example process for determining a storage format for dictionary encoded data, according to an embodiment. In step 302, it is determined how many bits are used to encode the data. If the total number of bits for each dictionary code does not fill the smallest partition of a SIMD register, then, in step 304, the codes are stored in vertical format. For example, if the smallest partition of a SIMD register is one byte, then data encoded with seven-bit or smaller codes would not fill the register. Thus, storing the codes in a horizontal format would result in wasted SIMD register space, and the codes are stored in a vertical format.

If the total number of bits in each individual code exactly fills one or more SIMD register partitions (e.g. eight-bit, sixteen-bit, or n-byte codes), then the codes may be processed in horizontal format without wasting any register space. Accordingly, the dictionary codes are stored in horizontal format in step 306.

If the total number of bits in each code is greater than the number of bits that the smallest partition of a SIMD register is able to hold but do not exactly fill one or more SIMD register partitions, then the dictionary codes are stored in a hybrid format in step 308. The horizontal component of each dictionary code stored at this step may correspond to the size of one or more SIMD register partitions. For example, the horizontal component may be generated based on byte-aligned boundaries as described above. Thus, the dictionary-encoded data may be loaded into a SIMD register and processed without wasting any register space.

Segmenting Dictionary-Encoded Data

In some embodiments, slices for vertically stored dictionary-encoded data are stored in segments, such that each individual segment represents n codes, where n is a positive integer greater than one. The number of codes in a particular segment may correspond to the number of bits in each slice stored in the segment. For example, if each segment has 128 codes, then each slice in a segment would have 128 bits. If the codes were five-bits in width, then a segment would have five slices of 128 bits each, resulting in an individual segment storing 5*128 bits. The next segment would then contain the next 128 codes.

For the hybrid representation, the horizontal portion of a code is placed within the same segment as the vertical portion of the code. This helps maintain data locality for more efficient cache and CPU utilization. For example, if each segment has 128 codes, then each individual segment would store the horizontal portion for the 128 codes followed by one or more slices, where each of the one or more slices stores 128 bits. Each segment may be contiguously stored or may be stored separately, depending on the particular implementation.

Figure 4:
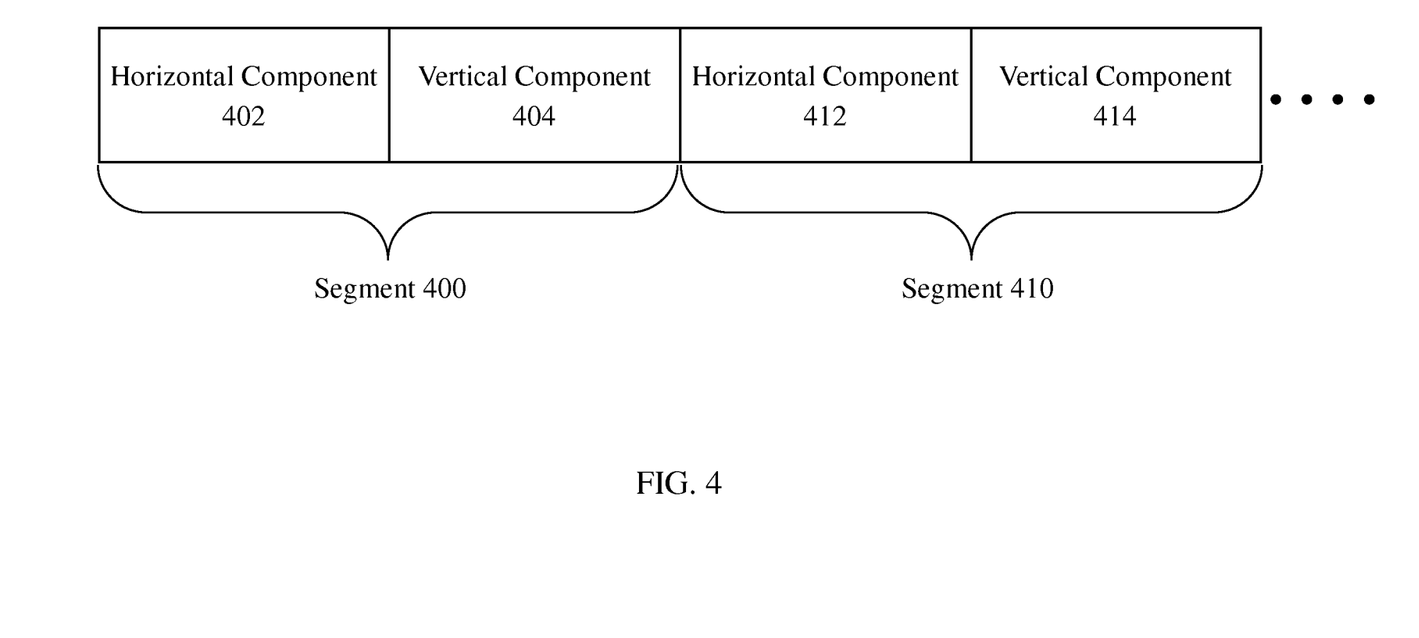
FIG. 4 is a block diagram depicting example segments storing a hybrid representation of dictionary-encoded data, according to an embodiment.

FIG. 4 is a block diagram depicting example segments storing a hybrid representation of dictionary-encoded data, according to an embodiment. Each segment stores n codes from the dictionary-encoded data, where n is a positive integer greater than two. Segment 400 stores the horizontal portion for each code in horizontal component 402 and a vertical portion for each code in vertical component 404. Vertical component 404 may include one or more slices, depending on the size of the codes and the boundary between the horizontal portion and the vertical portion. With 11-bit codes, for example, the horizontal portion may store the first eight bits of each code, while the remaining three-bits are stored in three slices corresponding to the different bit positions. Each slice stores n bits—one bit for each code in the segment at the corresponding bit position. Segments 410 stores the next n codes in horizontal component 412 and vertical component 414 according to the same format. If there are more codes, the next segment may store the next n codes, etcetera, until all the codes in the dictionary-encoded data are stored.

The size of a segment may vary from implementation to implementation. In some embodiments, the segment size may optimally be chosen based on the width of a SIMD register to facilitate performing SIMD operations. For example, if the width of a SIMD register is 128 bits, each segment may be configured to hold 128 codes. If the width of a SIMD register is 256 bits, each segment may be configured to hold 256 codes. Thus, the number of codes stored by each segment may match the width of the SIMD register.

Scanning Dictionary-Encoded Data

Scan operations involve searching dictionary-encoded data for codes that match a target value from a set of one or more target values. Non-indexed based scan operations may perform comparisons without decoding the dictionary-encoded data and, therefore, do not require reconstructing the codes when the codes are stored in a vertical or hybrid format. For example, the following query returns a result set of records from an employee table where the employee's age is 50: SELECT*FROM EMPLOYEE_TABLE WHERE AGE=50. If the AGE column is dictionary-encoded, a lookup may be performed in the dictionary to identify the corresponding dictionary code for age "50". The encoded AGE column is then scanned to identify records that have the matching dictionary code. Thus, records with a value of "50" in the AGE column may be identified without decoding the dictionary-encoded AGE column.

Figure 5:
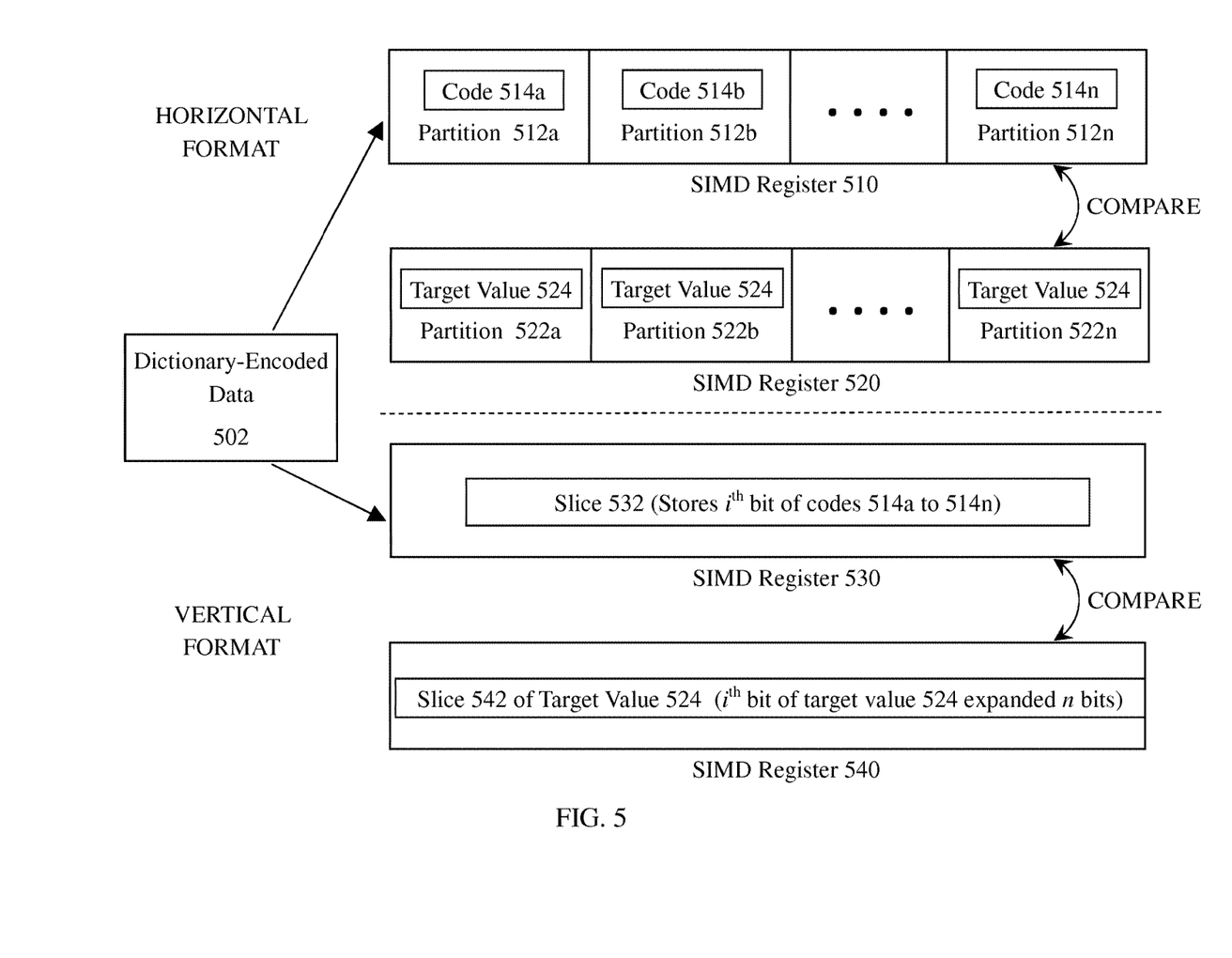
FIG. 5 is a block diagram depicting scans on dictionary-encoded data stored in a horizontal format and a vertical format, according to an embodiment.

The manner in which the scan operation is performed depends on the format of the dictionary-encoded data. FIG. 5 is a block diagram depicting scans on dictionary-encoded data stored in a horizontal format and a vertical format, according to an embodiment. To perform a scan of data in the horizontal format, codes 514*a* to 514*n* from dictionary-encoded data 502 are loaded into partitions 512*a* to 512*n* of SIMD register 510. Although only SIMD register 510 is depicted, other SIMD registers may also be loaded with codes at this step and/or the steps described below for the vertical and hybrid formats, depending on the particular implementation. Target value 524 is loaded into each of partitions 522*a* to 522*b* of SIMD register 520. In a single instruction cycle, each of codes 514*a* to 514*n* is compared substantially simultaneously with the corresponding target value in partitions 522*a* to 522*b* to generate a result vector identifying the matching rows. This process may be repeated one or more times if there are remaining codes in dictionary-encoded data 502.

If dictionary-encoded data 502 is stored in a vertical format rather than a horizontal format, then each slice is compared against a slice of target value 524. Accordingly, slice 532 of from dictionary-encoded data 502 may be loaded into SIMD register 530. Slice 542 of target value 524 is created by expanding the bit of target value 524 at the position corresponding to the bit position represented by slice 532 by the number of codes in a segment. For example, for five-bit codes, if slice 532 holds the fourth most significant bit for 128 codes, then the fourth most significant bit of target value 524 may be loaded into all 128 bits of register 540. The comparison between slice 532 and slice 542 is then made to create a bit-vector identifying rows in the slice that have matching bits in the particular bit position represented by slices 532 and 542. This process may be performed for each slice within the same segment of dictionary-encoded data 502. The resulting bit-vectors are then combined using one or more bitwise operations, such as a bitwise AND and OR operations, to generate a final bit-vector identifying rows that match the target value.

An advantage of vertically storing codes is that the entire SIMD register may be utilized in each operation with no wasted space even if the codes are not byte-aligned. For example, dictionary-encoded data 502 may comprise 128 five-bit codes and register 510 may be a 128-bit SIMD register that is partitionable at the byte-level. Accordingly, eight five-bit codes of the 128 five-bit codes may deposited into each separate eight-bit element in register 510, with three of the eight bits of each element being "wasted" during processing. With the vertical format, by contrast, one 128-bit slice may be loaded into register 510, fully utilizing register 510 during processing.

Scans on the hybrid representation may combine the approaches for scanning data above and achieve similar scan results that vertically stored dictionary codes are able to provide. In an example embodiment, the scan begins with the horizontal component. The horizontal portions of each code are loaded into one or more SIMD registers and compared with a corresponding portion (e.g., the first or last n bits) of a target value. When the horizontal component of the code is byte-aligned, near memory-bandwidth speeds may be achieved without wasting bits in SIMD registers during processing. The result of the horizontal scan is a bit-vector that identifies rows having a horizontal portion that match the corresponding portion of the target value. The bit-vector is then subsequently processed along with the scans of the vertical codes. For example, the bit-vector may be combined, using a bitwise AND operation, with the bit-vector results generated by scanning the vertical codes to generate a final bit-vector identifying rows that match the target value.

Figure 6:
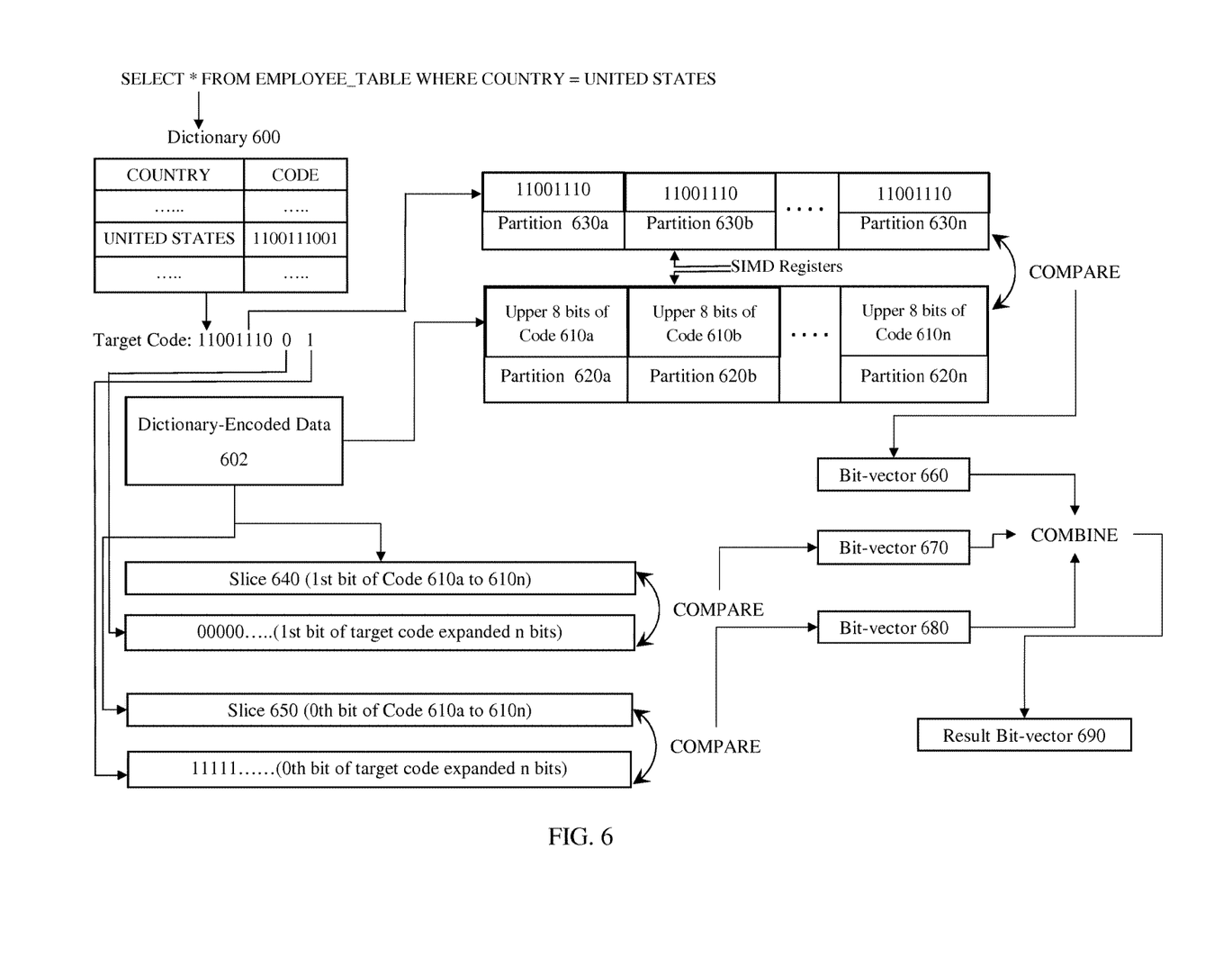
FIG. 6 is a block diagram depicting an example dictionary scan on dictionary-encoded data stored in a hybrid format, according to an embodiment.

FIG. 6 is a block diagram depicting an example dictionary scan on dictionary-encoded data stored in a hybrid format, according to an embodiment. In response to receiving the query SELECT*FROM EMPLOYEE_TABLE WHERE COUNTRY=UNITED STATES, a lookup is performed in dictionary 600 to identify the target dictionary code corresponding to United States. Based on the lookup, the target code 1100111001 is obtained. The scan operation begins with the horizontal component of one or more segments from dictionary-encoded data 602. At least a portion of the horizontal component is loaded into a SIMD register, with the horizontal portion for different codes (codes 610a to 610n) loaded into different partitions (partitions 620a to 620n). A corresponding portion—the first eight bits—of the target code is loaded into partitions 630a to 630n of one or more other SIMD registers. In a single instruction cycle, all the values in partitions 620a to 620n of the SIMD registers may be substantially simultaneously compared with the values loaded into partitions 630a to 630n to generate bit-victor 660 identifying matches within the horizontal component (e.g., a "1" in the bit-vector may correspond to a match and a "0" may correspond to a non-match, with one bit in the bit-vector for each code). Slice 640 is then loaded into a SIMD register, which may be the same SIMD register used to process the horizontal portion or a different SIMD register, depending on the particular implementation. The bit of the target code at the bit position corresponding to slice 640 is expanded and loaded into another SIMD register. These values are then compared to generate bit-vector 670 identifying rows where the $1^{st}$ bit of the code matches the $1^{st}$ bit of the target code (with one bit in the bit-vector for each code). This process is also performed for slice 650 for the $0^{th}$ bit to generate bit-vector 680. Once bit-vectors 660, 670, and 680 have been generated, a bitwise AND operation may be performed to generate final result bit-vector 690, which identifies all rows in the dictionary-encoded column that have a matching target code. This process may be repeated for other segments in dictionary-encoded data 602.

In some embodiments, the result of scanning the horizontal component may be used to perform pruning or filtering before the scan of the vertical component is complete. For example, bit-vector 660 may be used to remove rows from a result set for those rows with codes where the horizontal portion does not match the corresponding portion of the target code before bit-vectors 670, 680, and/or 690 are generated. Alternatively, the scan of both the horizontal and vertical components may be fully completed before filtering is performed.

Quick Stitching of Vertical and Hybrid Bit-Sliced Codes for Index-Based Operations Some operations, such as set-membership scan operations, may involve using codes as an index to the dictionary to look up and obtain a corresponding value. The query SELECT NAME FROM EMPLOYEE_TABLE WHERE AGE=50, for example, may involve decoding dictionary codes in the name column to return to an end user. When dictionary codes are stored in the vertical or hybrid format, the bits are not stored contiguously. In order to perform the dictionary lookup, the code is reconstructed by stitching the bits of the code back together such that all the bits are contiguously stored in memory.

For vertically-stored dictionary-encoded data, dictionary codes may be reconstructed using a set of lookup tables. If the dictionary-encoded data stores k-bit codes, then k lookup tables may be involved during construction, where k represents a positive integer. Each lookup table in the set of lookup tables takes a set of bits and deposits each bit from the set of bits into a different register partition at fixed positions, which correspond to the placement of the bits within a horizontal code. For example, a lookup table may use the input set of bits as an index to different register values that may be loaded into a SIMD register, where each register value spaces the input set of bits via bit padding such that each bit in the set of bits is loaded into a different SIMD register partition at a corresponding bit position. Accordingly, each lookup table determines the spacing and position of the set of bits within a SIMD register.

During processing, each slice in a segment is mapped to a different lookup table based on the bit position held by the slice. For example, if the slice holds the first bit of a plurality of codes, the slice is processed by a first lookup table that loads a corresponding register value into a SIMD register such that the bits in the slice are deposited in the first bit position in each partition of a SIMD register. If the slice holds the $0^{th}$ bit for the plurality of codes, the slice is processed by a second lookup table that loads a corresponding register value into a SIMD register such that the bits in the slice are deposited in the $0^{th}$ bit position in each partition of a SIMD register. Thus, each slice is processed by a single lookup table, which deposits the bits in their corresponding positions. After each slice is processed by the corresponding lookup table, the combined results are OR'd together to complete the reconstruction. Based on this process, n/8 codes of 8-bits or less may be reconstructed in parallel on an n-bit SIMD register.

For dictionary-encoded data stored in the hybrid format, the horizontal portion of the codes may first be loaded into SIMD registers. A shuffle instruction is then used to place the horizontal portion of each code in the appropriate position of a SIMD register. The slices in the hybrid representation are processed using lookup tables as described above for the vertical format to map each bit of the slice to a different SIMD register at a corresponding bit position.

The "stitching" or reconstruction of the code is done using one or more bitwise operations, such as a SIMD OR operation. For example, access into each lookup table results in a SIMD register load of a bit-vector. Each of these bit-vectors may be OR'd with the final result bit-vector to reconstruct the code. Operating on hybrid codes may be faster than on vertical codes since the horizontal portion of each code may be obtained without using lookup tables and bitwise operations.

Figure 7:
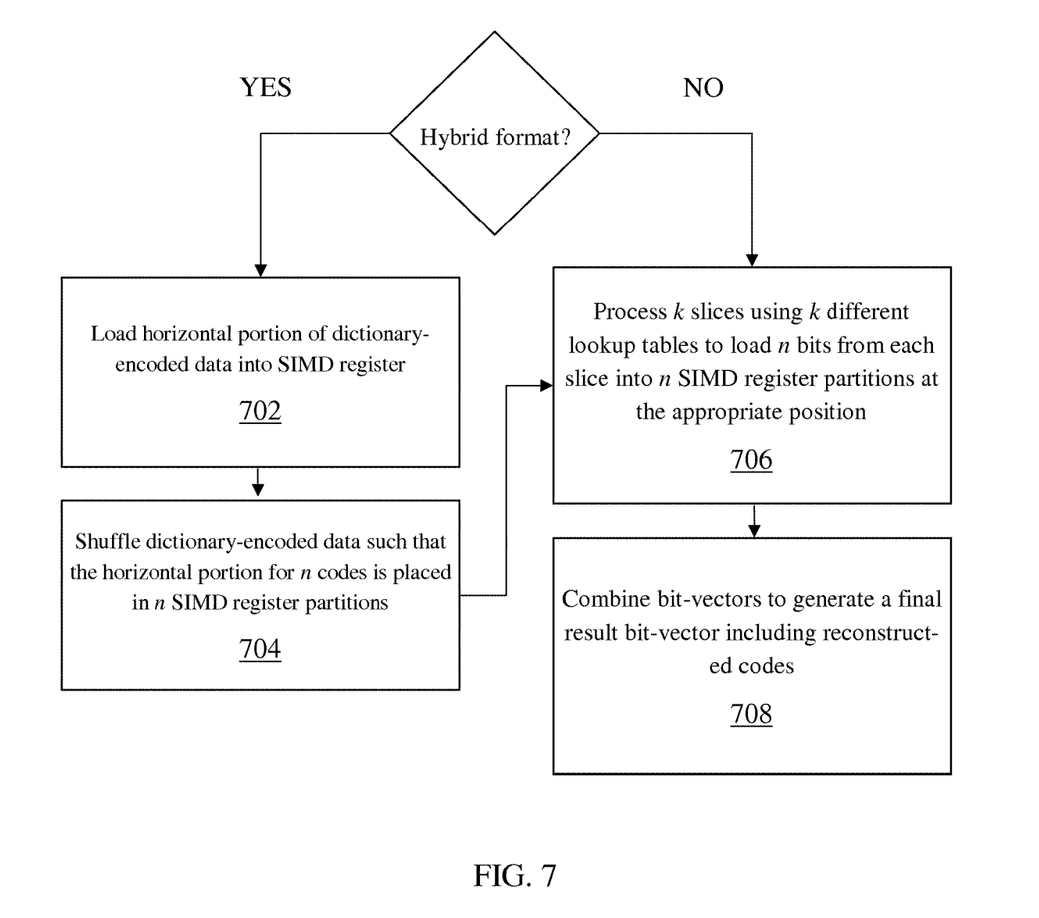
FIG. 7 is a flowchart depicting an example process for reconstructing codes stored in a vertical or hybrid format, according to an embodiment.

FIG. 7 is a flowchart depicting an example process for reconstructing codes stored in a vertical or hybrid format, according to an embodiment. If the codes are stored in a hybrid format, then, in step 702, a horizontal component is loaded into a SIMD register. If the codes are stored in a vertical format, then the process continues with step 706.

In step 704, a SIMD shuffle instruction moves horizontal portions for different codes loaded at step 702 into different partitions of a SIMD register. During this step, the horizontal portion of each code is placed at a corresponding portion within the partition of a SIMD register. For example, if the horizontal portion stores bits twelve to five of a thirteen-bit code, then the horizontal portion may be stored in the twelfth to fifth bit positions within the partition.

In step 706, each slice is processed by a different lookup table, where each lookup table generates a bit-vector that spaces bits within the slice based on the corresponding bit position represented by the slice. For example, if the slice holds bits from the third bit position in a code, then a bit-vector may be generated such that each bit is positioned in the third bit position in a SIMD register partition, and if the slice holds bits from the second bit position, then a bit-vector may be generated such that each bit is positioned in the second bit position of a SIMD register partition, etc. Each slice may index to a different lookup table based on the bit position of the bits stored in the slice. Continuing with the above example, the slice that holds bits from the third bit position in a code indexes to one lookup table, while the slice that holds bits from the second bit position indexes to a different lookup table. Thus, each individual lookup table is configured to deposit bits at a particular bit position within a register partition, and each slice maps to the appropriate lookup table.

In step 708, the one or more bit-vectors generated at step 704 and/or step 706 are combined to generate a final result bit-vector. In order to combine the bit-vectors one or more bitwise operations, such as SIMD OR operations are performed. The final result bit-vector is a plurality of codes in a horizontal format where all bits from the codes are contiguously stored.

Figure 8:
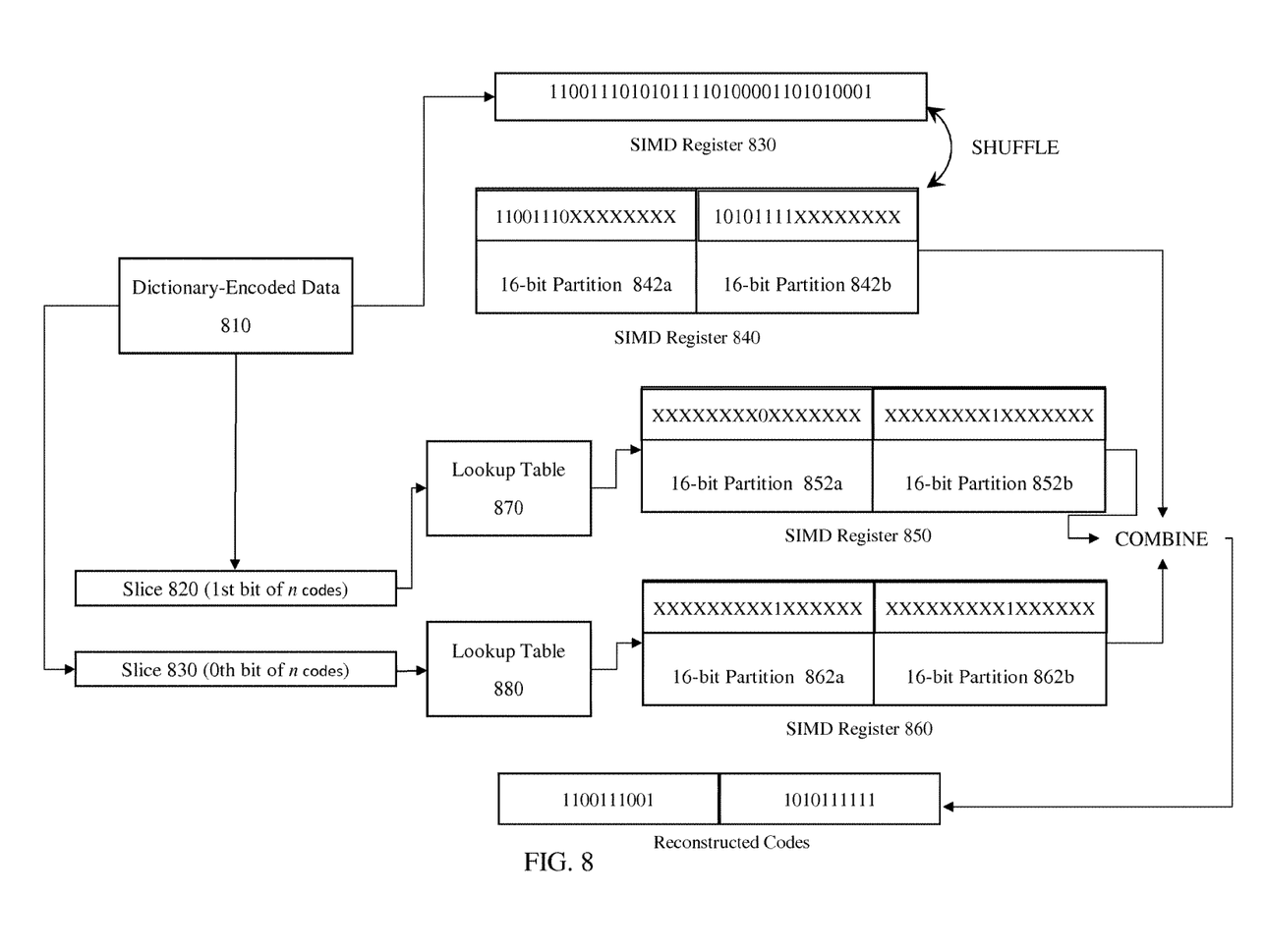
FIG. 8 depicts example code reconstructions for a hybrid representation of dictionary-encoded data, according to an embodiment.

FIG. 8 depicts example code reconstructions for a hybrid representation of dictionary-encoded data, according to an embodiment. Referring to FIG. 8, dictionary-encoded data 810 stores 10-bit codes, with eight-bits (the horizontal portion) of each code stored contiguously and two-bits stored in slices 820 and 830. SIMD register 830 is a 32-bit register. However, the register size may vary from implementation to implementation. Example register sizes may include, without limitation, 64-bit, 128-bit and 256-bit registers. The registers may be partitioned based on the size of the code that is being reconstructed. For 10-bit codes, for example, the registers may be partitioned into 16-bit elements. For 18-bit codes, the registers may be partitioned into 32-bit elements.

To begin the stitching process, the first 32-bits of horizontal component are loaded into SIMD register 830. A shuffle instruction then takes the first 8-bit value and second 8-bit value from SIMD register 830 and places these values in the appropriate position within partitions 842*a* and 842*b*, respectively, of SIMD register 840. Next, slice 820 goes through lookup table 870, and slice 830 goes through lookup table 880. Lookup table 870 maps the slice to a particular register value such that the first bit from slice 820 is deposited in the seventh bit position in partition 852*a* of SIMD register 850 and the second bit from slice 820 in the seventh bit position in partition 852*b* of SIMD register 850. A bitwise OR operation is then performed to stitch these bits to the bit-vector in SIMD register 840. Similarly, lookup table 880 deposits the first bit from slice 830 in the sixth bit position in partition 862*a* of SIMD register 860 (SIMD register 860 may be the same or a different register as SIMD register 850, depending on the particular implementation), and the second bit from slice 830 in the sixth bit position in partition 862*b* of SIMD register 860. A bitwise OR operation is then performed to combine the bit-vector in SIMD register 860 with the final result bit-vector in SIMD register 840 and to generate the first two dictionary codes. This process may then be repeated for the next 8-bits in SIMD register 830, using the next two bits of slices 820 and 830, respectively, to generate the next two codes. Once complete, SIMD register 830 may be reloaded with more dictionary-encoded data (either from the same or a different segment), and the process may be repeated to reconstruct the next n codes.

Some operations such as "set-membership" operations that are index-based are special because they involve decomposing the code into components. For example, a set operation may decompose a code into two components: a byte offset and a bit offset. Storing codes in a vertical format or hybrid format may facilitate such operations since the codes are fully or partially split at the bit-level. In such cases, the stitching operation described above may be performed for different portions of the code to stitch the codes into separate result vectors.

In other embodiments, one or more hardware instructions may be used to reconstruct the codes. For example, rather than lookup tables, a hardware instruction may be used to generate bit-vectors from slices and deposit them into the registers. The hardware instruction may utilize special-purpose hardware designed to receive a set of bits for a slice and deposit the bits into a register at their appropriate positions.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 9:
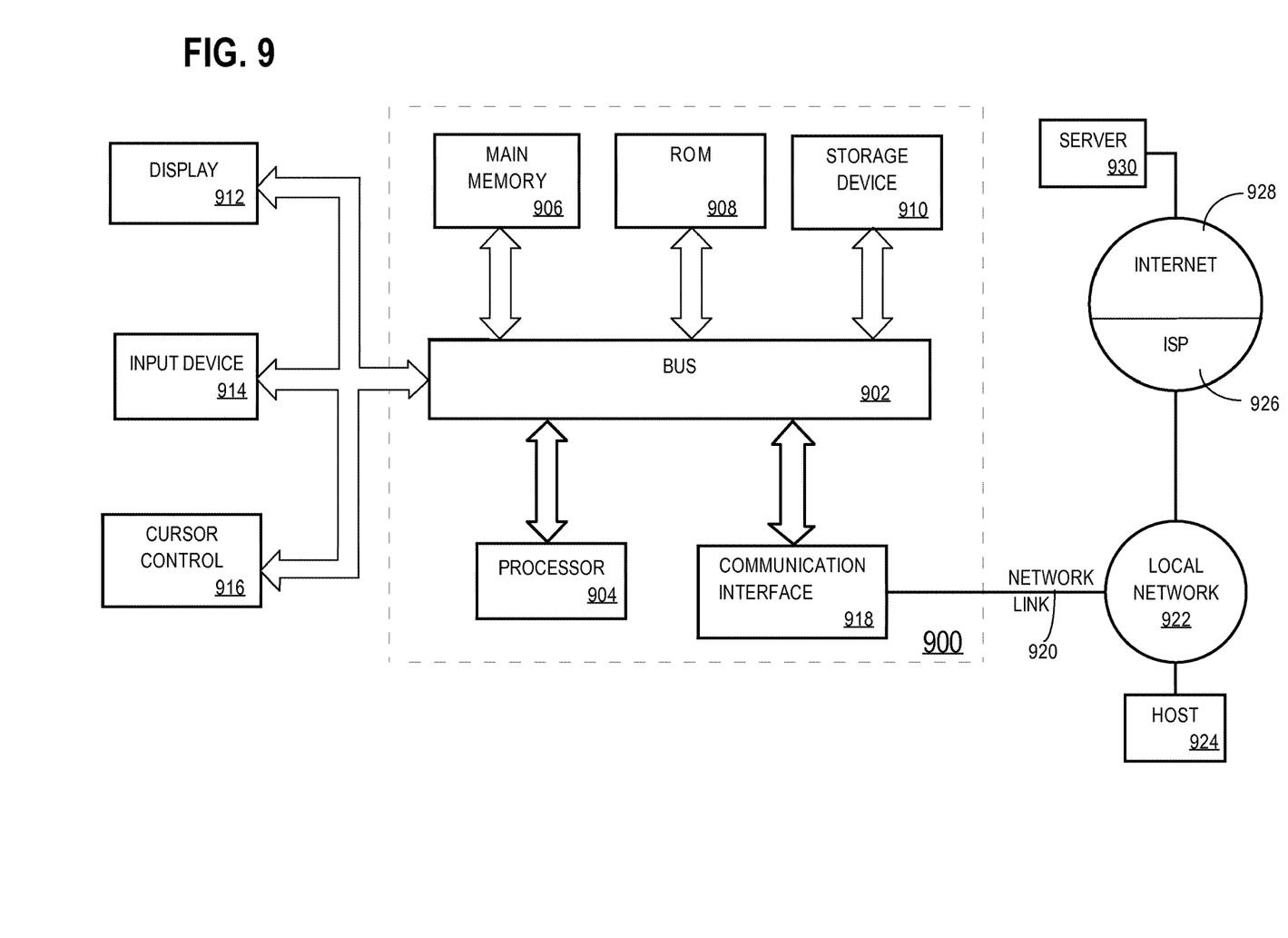
FIG. 9 is a block diagram depicting a computer system upon which an embodiment may be implemented.

For example, FIG. 9 is a block diagram that illustrates a computer system 900 upon which an embodiment of the invention may be implemented. Computer system 900 includes a bus 902 or other communication mechanism for communicating information, and a hardware processor 904 coupled with bus 902 for processing information. Hardware processor 904 may be, for example, a general purpose microprocessor.

Computer system 900 also includes a main memory 906, such as a random access memory (RAM) or other dynamic storage device, coupled to bus 902 for storing information and instructions to be executed by processor 904. Main memory 906 also may be used for storing temporary variables or other intermediate information during execution of instructions to be executed by processor 904. Such instructions, when stored in non-transitory storage media accessible to processor 904, render computer system 900 into a special-purpose machine that is customized to perform the operations specified in the instructions.

Computer system 900 further includes a read only memory (ROM) 908 or other static storage device coupled to bus 902 for storing static information and instructions for processor 904. A storage device 910, such as a magnetic disk, optical disk, or solid-state drive is provided and coupled to bus 902 for storing information and instructions.

Computer system 900 may be coupled via bus 902 to a display 912, such as a cathode ray tube (CRT), for displaying information to a computer user. An input device 914, including alphanumeric and other keys, is coupled to bus 902 for communicating information and command selections to processor 904. Another type of user input device is cursor control 916, such as a mouse, a trackball, or cursor direction keys for communicating direction information and command selections to processor 904 and for controlling cursor movement on display 912. This input device typically has two degrees of freedom in two axes, a first axis (e.g., x) and a second axis (e.g., y), that allows the device to specify positions in a plane.

Computer system 900 may implement the techniques described herein using customized hard-wired logic, one or more ASICs or FPGAs, firmware and/or program logic which in combination with the computer system causes or programs computer system 900 to be a special-purpose machine. According to one embodiment, the techniques herein are performed by computer system 900 in response to processor 904 executing one or more sequences of one or more instructions contained in main memory 906. Such instructions may be read into main memory 906 from another storage medium, such as storage device 910. Execution of the sequences of instructions contained in main memory 906 causes processor 904 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 910. Volatile media includes dynamic memory, such as main memory 906. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 902. Transmission media can also take the form of acoustic or light waves, such as those generated during radio-wave and infra-red data communications.

Various forms of media may be involved in carrying one or more sequences of one or more instructions to processor 904 for execution. For example, the instructions may initially be carried on a magnetic disk or solid-state drive of a remote computer. The remote computer can load the instructions into its dynamic memory and send the instructions over a telephone line using a modem. A modem local to computer system 900 can receive the data on the telephone line and use an infra-red transmitter to convert the data to an infra-red signal. An infra-red detector can receive the data carried in the infra-red signal and appropriate circuitry can place the data on bus 902. Bus 902 carries the data to main memory 906, from which processor 904 retrieves and executes the instructions. The instructions received by main memory 906 may optionally be stored on storage device 910 either before or after execution by processor 904.

Computer system 900 also includes a communication interface 918 coupled to bus 902. Communication interface 918 provides a two-way data communication coupling to a network link 920 that is connected to a local network 922. For example, communication interface 918 may be an integrated services digital network (ISDN) card, cable modem, satellite modem, or a modem to provide a data communication connection to a corresponding type of telephone line. As another example, communication interface 918 may be a local area network (LAN) card to provide a data communication connection to a compatible LAN. Wireless links may also be implemented. In any such implementation, communication interface 918 sends and receives electrical, electromagnetic or optical signals that carry digital data streams representing various types of information.

Network link 920 typically provides data communication through one or more networks to other data devices. For example, network link 920 may provide a connection through local network 922 to a host computer 924 or to data equipment operated by an Internet Service Provider (ISP) 926. ISP 926 in turn provides data communication services through the world wide packet data communication network now commonly referred to as the "Internet" 928. Local network 922 and Internet 928 both use electrical, electromagnetic or optical signals that carry digital data streams. The signals through the various networks and the signals on network link 920 and through communication interface 918, which carry the digital data to and from computer system 900, are example forms of transmission media.

Computer system 900 can send messages and receive data, including program code, through the network(s), network link 920 and communication interface 918. In the Internet example, a server 930 might transmit a requested code for an application program through Internet 928, ISP 926, local network 922 and communication interface 918.

The received code may be executed by processor 904 as it is received, and/or stored in storage device 910, or other non-volatile storage for later execution.

Extensions and Alternatives

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method comprising:
   storing dictionary-encoded data consisting of a plurality of codes by:
   contiguously storing a first portion of each code of the plurality of codes, wherein each code is a key of a dictionary for encoding the dictionary-encoded data;
   storing one or more bits from a second portion of each code of the plurality of codes in one or more slices;
   wherein:
      each key of the dictionary has a same size;
      all of the first portions of all of the plurality of codes are contiguously stored;
      the second portion of each code of the plurality of codes comprises a same sequence of bit positions;
      each bit position of said same sequence of bit positions corresponds to a distinct slice of the one or more slices;
      each slice of the one or more slices stores a single bit from a corresponding bit position in the second portion of each code of the plurality of codes.

2. The method of claim 1,
   wherein the first portion of each code of the plurality of codes are stored contiguously in a horizontal component for a hybrid representation of the plurality of codes;
   wherein the one or more slices are stored contiguously in a vertical component for the hybrid representation of the plurality of codes.

3. The method of claim 2, further comprising performing a scan operation on the dictionary-encoded data to identify rows within the dictionary-encoded data with a matching target code, wherein performing the scan operation on the dictionary-encoded data comprises:
   loading the first portion of each code of the plurality of codes into a different partition of one or more single-instruction multiple data (SIMD) registers;
   comparing the first portion of each code with a first portion of the matching target code to generate a first bit-vector;
   loading the one or more slices into the one or more SIMD registers;
   comparing the one or more slices with a slice of the matching target code to generate a second bit-vector;
   combining the first bit-vector and the second bit-vector to generate a third bit-vector that identifies the rows within the dictionary-encoded data with the matching target code.

4. The method of claim 1,
   wherein the one or more slices comprise a plurality of slices corresponding to different bit positions,
   wherein each respective slice of the plurality of slices stores an individual bit from each code of the plurality of codes with the corresponding bit position in the code.

5. The method of claim 1,
   wherein the plurality of bits from the first portion have a width equal to one or more whole bytes;
   wherein the one or more bits from the second portion do not have a width equal to one or more whole bytes.

6. The method of claim 1,
   wherein the first portion of each code in the plurality of codes and the second portion of each code in the plurality of codes are stored in a first segment, the method further comprising:
   storing each code of a second plurality of codes in the dictionary-encoded data in a second segment.

7. The method of claim 1,
   wherein the dictionary-encoded data is a dictionary-encoded column;
   wherein each code of the plurality of codes corresponds to a different entry in the dictionary-encoded column.

8. A method for storing and processing a plurality of codes included in dictionary-encoded data, the method comprising:
   storing at least one slice, wherein the at least one slice corresponds to a particular bit position and stores a plurality of bits;
   wherein each respective bit of the plurality of bits is from a different respective code of the plurality of codes and at the particular bit position within the respective code, wherein the respective code has a same-sized value of a key of a dictionary for encoding the dictionary-encoded data;
   generating at least one bit-vector based on the at least one slice by loading each respective bit of the plurality of bits into different respective partitions in a register at a bit position based on the particular bit position corresponding to the at least one slice;
   reconstructing the plurality of codes based on the at least one bit-vector by combining the at least one bit-vector with one or more other bit-vectors;
   wherein:
      each key of the dictionary has a same size;
      the one or more other bit-vectors include bits for the plurality of codes corresponding to at least one bit position different than the particular bit position.

9. The method of claim 8, wherein generating the at least one bit-vector based on the at least one slice comprises:
   identifying a particular lookup table from a set of lookup tables based on the particular bit position corresponding to the at least one slice;
   wherein the particular lookup table expands the at least one slice such that the plurality of bits are spaced at the particular bit position within the different respective partitions when loaded into the register.

10. The method of claim 8, wherein the at least one slice is part of a vertical component for the plurality of codes, the method further comprising:
    storing a horizontal component for the plurality of codes;
    wherein the horizontal component includes a horizontal portion of each respective code of the plurality of codes.

11. The method of claim 10, further comprising:
    loading the horizontal component into a SIMD register;
    shuffling the horizontal component within the SIMD register such that the horizontal portion of each respective code of the plurality of codes is placed in a different partition of the SIMD register;
    wherein reconstructing the plurality of codes based on the at least one bit-vector by combining the at least one bit-vector with one or more other bit-vectors comprises combining the at least one bit-vector with a bit-vector generated by said shuffling.

12. The method of claim 8, wherein the one or more other bit-vectors comprise bit-vectors generated from one or more slices different from the at least one slice.

13. One or more non-transitory computer-readable media storing instructions, which, when executed by one or more processors, cause:

storing dictionary-encoded data consisting of a plurality of codes by:
contiguously storing a first portion of each code of the plurality of codes, wherein each code is a key of a dictionary for encoding the dictionary-encoded data;
storing one or more bits from a second portion of each code of the plurality of codes in one or more slices;
wherein:
each key of the dictionary has a same size;
all of the first portions of all of the plurality of codes are contiguously stored;
the second portion of each code of the plurality of codes comprises a same sequence of bit positions;
each bit position of said same sequence of bit positions corresponds to a distinct slice of the one or more slices;
each slice of the one or more slices stores a single bit from a corresponding bit position in the second portion of each code of the plurality of codes.

14. The one or more non-transitory computer-readable media of claim 13,
wherein the first portion of each code of the plurality of codes are stored contiguously in a horizontal component for a hybrid representation of the plurality of codes;
wherein the one or more slices are stored contiguously in a vertical component for the hybrid representation of the plurality of codes.

15. The one or more non-transitory computer-readable media of claim 14, further comprising instructions for performing a scan operation on the dictionary-encoded data to identify rows within the dictionary-encoded data with a matching target code, wherein the instructions for performing the scan operation on the dictionary-encoded data comprise instructions for:
loading the first portion of each code of the plurality of codes into a different partition of one or more single-instruction multiple data (SIMD) registers;
comparing the first portion of each code with a first portion of the matching target code to generate a first bit-vector;
loading the one or more slices into the one or more SIMD registers;
comparing the one or more slices with a slice of the matching target code to generate a second bit-vector;
combining the first bit-vector and the second bit-vector to generate a third bit-vector that identifies the rows within the dictionary-encoded data with the matching target code.

16. The one or more non-transitory computer-readable media of claim 13,
wherein the one or more slices comprise a plurality of slices corresponding to different bit positions,
wherein each respective slice of the plurality of slices stores an individual bit from each code of the plurality of codes with the corresponding bit position in the code.

17. The one or more non-transitory computer-readable media of claim 13,
wherein the plurality of bits from the first portion have a width equal to one or more whole bytes;
wherein the one or more bits from the second portion do not have a width equal to one or more whole bytes.

18. The one or more non-transitory computer-readable media of claim 13,
wherein the first portion of each code in the plurality of codes and the second portion of each code in the plurality of codes are stored in a first segment, wherein the instructions, when executed by one or more processors, further cause:
storing each code of a second plurality of codes in the dictionary-encoded data in a second segment.

19. The one or more non-transitory computer-readable media of claim 13,
wherein the dictionary-encoded data is a dictionary-encoded column;
wherein each code of the plurality of codes corresponds to a different entry in the dictionary-encoded column.

20. One or more non-transitory computer-readable media storing instructions, which, when executed by one or more processors, cause:
storing at least one slice, wherein the at least one slice corresponds to a particular bit position and stores a plurality of bits;
wherein each respective bit of the plurality of bits is from a different respective code of a plurality of codes and at the particular bit position within the respective code, wherein the respective code has a same-sized value of a key of a dictionary for encoding dictionary-encoded data;
generating at least one bit-vector based on the at least one slice by loading each respective bit of the plurality of bits into different respective partitions in a register at a bit position based on the particular bit position corresponding to the at least one slice;
reconstructing the plurality of codes based on the at least one bit-vector by combining the at least one bit-vector with one or more other bit-vectors;
wherein:
each key of the dictionary has a same size;
the one or more other bit-vectors include bits for the plurality of codes corresponding to at least one bit position different than the particular bit position.

21. The one or more non-transitory computer-readable media of claim 20, wherein instructions for generating the at least one bit-vector based on the at least one slice comprise instructions for:
identifying a particular lookup table from a set of lookup tables based on the particular bit position corresponding to the at least one slice;
wherein the particular lookup table expands the at least one slice such that the plurality of bits are spaced at the particular bit position within the different respective partitions when loaded into the register.

22. The one or more non-transitory computer-readable media of claim 20, wherein the at least one slice is part of a vertical component for the plurality of codes, the one or more non-transitory computer-readable media further storing instructions, which, when executed by the one or more processors, cause the one or more computing devices to perform:
storing a horizontal component for the plurality of codes;
wherein the horizontal component includes a horizontal portion of each respective code of the plurality of codes.

23. The one or more non-transitory computer-readable media of claim 22, further storing instructions which, when executed by the one or more processors, cause the one or more computing devices to perform:
loading the horizontal component into a SIMD register;
shuffling the horizontal component within the SIMD register such that the horizontal portion of each respective code of the plurality of codes is placed in a different partition of the SIMD register;

wherein reconstructing the plurality of codes based on the at least one bit-vector by combining the at least one bit-vector with one or more other bit-vectors comprises combining the at least one bit-vector with a bit-vector generated by said shuffling.

24. The one or more non-transitory computer-readable media of claim 20, wherein the one or more other bit-vectors comprise bit-vectors generated from one or more slices different from the at least one slice.

25. The method of claim 2, wherein the horizontal component and the vertical component are stored contiguously.

\* \* \* \* \*

UNITED STATES PATENT AND TRADEMARK OFFICE
CERTIFICATE OF CORRECTION

PATENT NO. : 10,078,521 B2
APPLICATION NO. : 14/242778
DATED : September 18, 2018
INVENTOR(S) : Chavan et al.

Page 1 of 1

It is certified that error appears in the above-identified patent and that said Letters Patent is hereby corrected as shown below:

In the Specification

In Column 7, Line 51, delete "victor" and insert -- vector --, therefor.

Signed and Sealed this
Ninth Day of July, 2019

Andrei Iancu
*Director of the United States Patent and Trademark Office*